United States Patent
Hashimoto et al.

(10) Patent No.: US 7,037,371 B1
(45) Date of Patent: May 2, 2006

(54) METHOD FOR FABRICATING SEMICONDUCTOR DEVICE

(75) Inventors: Shin Hashimoto, Hirakata (JP); Takenobu Kishida, Nagaokakyo (JP); Kyoko Egashira, Kyoto (JP); Yoshifumi Hata, Joyo (JP); Toru Nishiwaki, Toyama (JP); Tomoya Tanaka, Nagaokakyo (JP)

(73) Assignee: Matsushita Electric Industrial Co., Ltd., (JP)

( * ) Notice: Subject to any disclaimer, the term of this patent is extended or adjusted under 35 U.S.C. 154(b) by 0 days.

(21) Appl. No.: 09/856,823

(22) PCT Filed: Oct. 3, 2000

(86) PCT No.: PCT/JP00/06851

§ 371 (c)(1),
(2), (4) Date: May 25, 2001

(87) PCT Pub. No.: WO01/26143

PCT Pub. Date: Apr. 12, 2001

(30) Foreign Application Priority Data

Oct. 4, 1999 (JP) .................................. 11-282668
Aug. 31, 2000 (JP) ............................... 2000-263467

(51) Int. Cl.
*H01L 21/28* (2006.01)

(52) U.S. Cl. ............... 117/108; 117/106; 148/DIG. 19; 148/DIG. 46; 438/795; 438/585; 438/581

(58) Field of Classification Search ............... 117/108, 117/106; 148/DIG. 19, DIG. 46; 438/795, 438/585, 581
See application file for complete search history.

(56) References Cited

U.S. PATENT DOCUMENTS

| 4,469,527 | A | * | 9/1984 | Sugano et al. ...... 148/DIG. 117 |
| 4,479,829 | A | | 10/1984 | Kniepkamp |
| 4,819,037 | A | * | 4/1989 | Sakakibara et al. ........... 257/24 |
| 4,861,750 | A | | 8/1989 | Nogawa et al. |
| 4,992,298 | A | | 2/1991 | Deutchman et al. |
| 5,010,037 | A | * | 4/1991 | Lin et al. ...................... 117/8 |
| 5,314,839 | A | * | 5/1994 | Mizutani et al. ..... 148/DIG. 76 |
| 5,728,625 | A | * | 3/1998 | Tung ......................... 438/586 |
| 5,780,929 | A | * | 7/1998 | Zeininger et al. ........... 257/751 |
| 5,830,775 | A | * | 11/1998 | Maa et al. ........... 148/DIG. 19 |
| 5,874,342 | A | * | 2/1999 | Tsai et al. .................... 438/301 |

(Continued)

FOREIGN PATENT DOCUMENTS

EP 800204 A2 10/1997

(Continued)

OTHER PUBLICATIONS

Sun et al. "Suppression of Cobalt Silicide Agglomeration Using Nitrogen Implantation", IEEE Electron Device Letters, vol. 19, N 5, May 1998.*

(Continued)

*Primary Examiner*—Robert Kunemuno
*Assistant Examiner*—Matthew J. Song
(74) *Attorney, Agent, or Firm*—Nixon Peabody LLP; Donald R. Studebaker

(57) ABSTRACT

After distributing a nonmetal element in a region in the vicinity of a surface portion of a semiconductor layer, a metal film is deposited on the semiconductor layer. Next, a semiconductor-metal compound layer is epitaxially grown in the surface portion of the semiconductor layer by causing a reaction between an element included in the semiconductor layer and a metal included in the metal film through annealing carried out on the metal film.

16 Claims, 8 Drawing Sheets

U.S. PATENT DOCUMENTS

| | | | |
|---|---|---|---|
| 5,930,608 A * | 7/1999 | Yamazaki et al. | 438/166 |
| 5,956,579 A * | 9/1999 | Yamazaki et al. | 438/151 |
| 6,017,826 A * | 1/2000 | Zhou et al. | 438/720 |
| 6,100,575 A * | 8/2000 | Minato | 257/617 |
| 6,346,465 B1 * | 2/2002 | Miura et al. | 438/542 |

FOREIGN PATENT DOCUMENTS

| | | |
|---|---|---|
| JP | 4-37167 A | 2/1992 |
| JP | 7-78788 A | 3/1995 |

OTHER PUBLICATIONS

Sun et al., "Impact of Nitrogen Implantation into Polysilicon Gate on Thermal Stability of Cobalt Silicide Formed on Polysilicon Gate", IEEE Transactions of Electron Devices, vol. 45, No. 9, Sep. 1998.*

R.T. Tung, "Oxide Mediated Epitaxy of $CoSi_2$ on Silicon", pp. 3461-3463, Jun. 10, 1996, Appl. Phys. Lett. 68 (24).

K. Goto et al., "Leakage Machanism and Optimized Conditions of Co Salicide Process for Deep-Submicron CMOS Devices", pp. 449-452, 1995, IEDM.

International Search Report dated Dec. 19, 2000.

M. Moll et al., "Relation Between Microscopic Defects And Macroscopic Changes In Silicon Detector Properties After Hadron Irradiation", Nuclear instruments and Methods in Physics Research B 186 (2002); pp. 100-110.

B. Gersey et al., "Neutron Dosimetry Using Tissue Equivalent And Silicon Equivalent Proportional Counters For Eight High-Energy Neutron Spectra", 14th Space Radiation Health Investigator's Workshop; Apr. 27-30, 2003; pp. 73-75; Texas.

E. Normand et al., "Neutron-Induced Single Event Burmout in High Voltage Electronics", IEEE Transactions on Nuclear Science, vol. 44, No. 6, Dec. 1997, pp. 2358-2366.

D. McGregor et al., "Bulk GaAs-Based Neutron Detectors For Spent Fuel Analysis", 8th International Conference on Nuclear Engineering, ICON-8827, Apr. 2-6, 2000, pp. 1-8; Baltimore, MD.

* cited by examiner

METHOD FOR FABRICATING SEMICONDUCTOR DEVICE

TECHNICAL FIELD

The present invention relates to a method for epitaxially growing a semiconductor-metal compound layer, in particular, a semiconductor-metal compound layer with high crystal orientation, in a surface portion of a semiconductor layer.

BACKGROUND ART

In a semiconductor integrated circuit device required to be operated at a high speed, in accordance with recent refinement of semiconductor devices, increase in the sheet resistance and the contact resistance of a semiconductor layer including an impurity dispersed therein has become a serious problem.

As one means for overcoming this problem, a process for forming a silicide layer in a surface portion of the semiconductor layer has been proposed. A variety of metals have been proposed to be used for forming the silicide layer, among which a cobalt disilicide ($CoSi_2$) layer formed by using cobalt is regarded as a particularly promising silicide layer because it is good in both thermal stability and specific resistance.

In the case where a surface portion of a silicon substrate is silicided by using cobalt, however, agglomeration can be caused in the cobalt silicide layer or a spike defect can be caused in the cobalt silicide layer during a reaction process occurring between cobalt atoms and silicon atoms (IEDM 1995-449, K. Goto). The agglomeration of the cobalt silicide layer leads to open circuit failure, and the occurrence of a spike defect leads to junction leakage.

As means for preventing the agglomeration and the occurrence of a spike defect in the cobalt silicide layer, a method for forming a cobalt silicide layer by epitaxial growth as follows is proposed in an article (Appl. Phys. Lett. 68, 1996, June). Specifically, the article proposes a technique of epitaxial growth of a cobalt silicide layer (oxide mediated epitaxy; OME) by forming a $SiO_x$ (x<2) film with a thickness of 0.5 through 1.5 nm on a semiconductor layer of silicon crystal, depositing a cobalt film in approximately several nm on the $SiO_x$ film under ultra high vacuum and carrying out annealing for causing a reaction between cobalt atoms and silicon atoms. It is also described that the $SiO_x$ film plays a role for promoting the growth of the cobalt silicide layer.

However, the aforementioned method for forming a cobalt silicide layer by the epitaxial growth requires ultra-high vacuum equipment for the deposition of a cobalt film, and the ultra-high vacuum equipment is not employed in a general process for semiconductors of silicon. Therefore, this method is not suitable to the mass production process.

Furthermore, since the cobalt film is formed on the $SiO_x$ (x<2) film having a very small thickness and including silicon excessively as compared with a stoichiometric composition, various problems occur in the aforementioned method due to variation in the film quality and the thickness of the $SiO_x$ film. Specifically, in the case where a pin hole is formed in the $SiO_x$ film, cobalt and silicon are explosively reacted to each other through the pin hole, and hence, there arises a problem that the cobalt silicide layer cannot be epitaxially grown; and in the case where the thickness of the $SiO_x$ film is fluctuated, the reaction between the cobalt atoms and the silicon atoms is too rapidly proceeded in a portion with a small thickness, and hence, there arises a problem that the cobalt silicide layer cannot be satisfactorily epitaxially grown.

DISCLOSURE OF THE INVENTION

In consideration of the aforementioned problems, an object of the invention is stably epitaxially growing a semiconductor-metal compound layer, such as a cobalt silicide layer, free from agglomeration and a spike defect under a vacuum region or by using a fabrication system generally employed in the semiconductor mass-production process.

In order to achieve the object, the present inventors have variously examined the causes of the agglomeration and a spike defect occurring in a cobalt silicide layer formed by the epitaxial growth, resulting in finding the following: Thermodynamically, the mechanism for forming cobalt silicide through a reaction between cobalt atoms and silicon atoms is brought by proceeding a reaction, $CO_2Si \rightarrow CoSi \rightarrow CoSi_2$. In the reaction path of $CO_2Si \rightarrow CoSi \rightarrow CoSi_2$, however, the interface energy is so unstable and ununiform that cobalt silicide is polycrystallized, resulting in causing agglomeration and a spike defect.

Accordingly, the present inventors have concluded that $CoSi_2$ can be formed without passing through the reaction path of $CO_2Si \rightarrow CoSi \rightarrow CoSi_2$ by epitaxially growing the cobalt silicide layer after forming a seed layer of $CoSi_2$ on the interface between a semiconductor layer including silicon and a cobalt film.

Therefore, a variety of examination has been made on a method for forming a seed layer of $CoSi_2$ on the interface between the semiconductor layer including silicon and the cobalt film. As a result, it has been found that a seed layer of $CoSi_2$ can be formed by controlling the concentration of oxygen atoms present between the semiconductor layer and the cobalt film. Specifically, when a cobalt film is deposited on a semiconductor layer including oxygen atoms distributed in a region in the vicinity of the surface, the amount of oxygen atoms sandwiched between the semiconductor layer and the cobalt film is decreased as compared with the case where a $SiO_x$ film is sandwiched between the semiconductor layer and the cobalt film. Therefore, the seed layer of $CoSi_2$ can be formed between the semiconductor layer and the cobalt film.

The present invention was devised on the basis of these findings, and specifically, the first method for fabricating a semiconductor device of this invention comprises the steps of distributing a nonmetal element in a region in the vicinity of a surface portion of a semiconductor layer; depositing a metal film on the semiconductor layer; and epitaxially growing a semiconductor-metal compound layer in the surface portion of the semiconductor layer by causing a reaction between an element included in the semiconductor layer and a metal included in the metal film through annealing carried out on the metal film.

In the first method for fabricating a semiconductor device of this invention, the metal film is deposited on the semiconductor layer after distributing the nonmetal element in the region in the vicinity of the surface portion of the semiconductor layer, and thereafter, the reaction between the element included in the semiconductor layer and the metal included in the metal film is caused by carrying out the annealing on the metal film. Therefore, the metal included in the metal film and the element included in the semiconductor layer can be avoided from too rapidly reacting with each other, so as to prevent polycrystallization of the semiconductor-metal compound layer. Thus, according to the invention, a semiconductor-metal compound layer free from agglomeration and a spike defect can be stably formed under vacuum generally employed in the semiconductor mass production process and at a low temperature.

In the first method for fabricating a semiconductor device, the step of distributing the nonmetal element preferably includes the steps of forming a compound layer including a semiconductor element and the nonmetal element on the semiconductor layer; distributing the nonmetal element included in the compound layer in the region in the vicinity of the surface portion of the semiconductor layer through recoil by irradiating the compound layer with a particle energy beam; and removing the compound layer.

In this manner, the nonmetal element included in the compound layer can be definitely distributed in the region in the vicinity of the surface portion of the semiconductor layer through the recoil caused by the irradiation with the particle energy beam.

In the first method for fabricating a semiconductor device, the step of distributing the nonmetal element preferably includes the steps of forming a compound layer including a semiconductor element and the nonmetal element on the semiconductor layer; and distributing the nonmetal element included in the compound layer in the region in the vicinity of the surface portion of the semiconductor layer through recoil and removing the compound layer by irradiating the compound layer with a particle energy beam.

In this manner, the nonmetal element included in the compound layer can not only be definitely distributed in the region in the vicinity of the surface portion of the semiconductor layer through the recoil caused by the irradiation with the particle energy beam, but also there is no need to conduct the step of removing the compound layer.

In these cases, a semiconductor layer having a face-centered cubic crystal structure, a semiconductor-metal compound layer having a face-centered cubic crystal structure and an amorphous compound layer can be used.

Also in these cases, the particle energy beam preferably includes a nonmetal element.

In this manner, the element included in the particle energy beam can be prevented from harmfully affecting the semiconductor layer.

In the first method for fabricating a semiconductor device, a semiconductor layer having a face-centered cubic crystal structure and a semiconductor-metal compound layer having a face-centered cubic crystal structure can be used.

In the first method for fabricating a semiconductor device, a semiconductor layer having a diamond or zinc blende crystal structure and a semiconductor-metal compound layer having a calcium fluoride crystal structure can be used.

Preferably, in the first method for fabricating a semiconductor device, the semiconductor layer is a silicon layer, the nonmetal element is oxygen, the metal film is a cobalt film, and the semiconductor-metal compound layer is a cobalt silicide layer.

In this manner, a cobalt silicide layer that is thermally stable and has low sheet resistance can be definitely epitaxially grown in the surface portion of the semiconductor layer.

In this case, the oxygen preferably has a concentration of $4 \times 10^{14}$ through $4 \times 10^{15}$ cm$^{-2}$.

In this manner, the reaction between cobalt atoms and silicon atoms can be satisfactorily proceeded, so that a cobalt silicide layer can be satisfactorily epitaxially grown in the surface portion of the silicon layer.

Also in this case, the step of distributing the nonmetal element preferably includes a step of forming a silicon oxide film on the silicon layer and distributing oxygen included in the silicon oxide film in the region in the vicinity of the surface portion of the silicon layer by irradiating the silicon oxide film with the particle energy beam.

In this manner, oxygen atoms can be definitely distributed in the region in the vicinity of the surface portion of the silicon layer.

The second method for fabricating a semiconductor device of this invention comprises the steps of forming a gate electrode on a semiconductor layer; forming impurity layers on both sides of the gate electrode in the semiconductor layer; distributing a nonmetal element in a region in the vicinity of a surface portion of the semiconductor layer; depositing a metal film on the semiconductor layer; and epitaxially growing a semiconductor-metal compound layer in the surface portion of the semiconductor layer by causing a reaction between an element included in the semiconductor layer and a metal included in the metal film through annealing carried out on the metal film.

In the second method for fabricating a semiconductor device of this invention, a cobalt silicide layer that is thermally stable and has low sheet resistance and contact resistance can be formed in a surface portion of the semiconductor layer serving as a source or drain region, and a silicide layer with good quality can be formed in a surface portion of the gate electrode. As a result, the performance of a semiconductor integrated circuit device including the MOSFET can be improved without increasing the number of fabrication procedures.

In the second method for fabricating a semiconductor device, the step of distributing the nonmetal element preferably includes the steps of forming a compound layer including a semiconductor element and the nonmetal element on the semiconductor layer; distributing the nonmetal element included in the compound layer in the region in the vicinity of the surface portion of the semiconductor layer through recoil by irradiating the compound layer with a particle energy beam; and removing the compound layer.

In this manner, the nonmetal element included in the compound layer can be definitely distributed in the region in the vicinity of the surface portion of the semiconductor layer through the recoil caused by the irradiation with the particle energy beam.

Preferably, in the second method for fabricating a semiconductor device, the semiconductor layer is a silicon layer, the nonmetal element is oxygen, the metal film is a cobalt film, and the semiconductor-metal compound layer is a cobalt silicide layer.

In this manner, a cobalt silicide layer that is thermally stable and has low sheet resistance can be definitely epitaxially grown in the surface portion of the semiconductor layer.

In this case, the oxygen preferably has a concentration of $4 \times 10^{14}$ through $4 \times 10^{15}$ cm$^{-2}$.

In this manner, the reaction between cobalt atoms and silicon atoms can be satisfactorily proceeded, so that the cobalt silicide layer can be satisfactorily epitaxially grown in the surface portion of the silicon layer.

BEST MODE FOR CARRYING OUT THE INVENTION

Embodiment 1

A semiconductor device according to Embodiment 1 of the invention will now be described with reference to FIGS. 1(a) and 1(b).

Figure 1A:
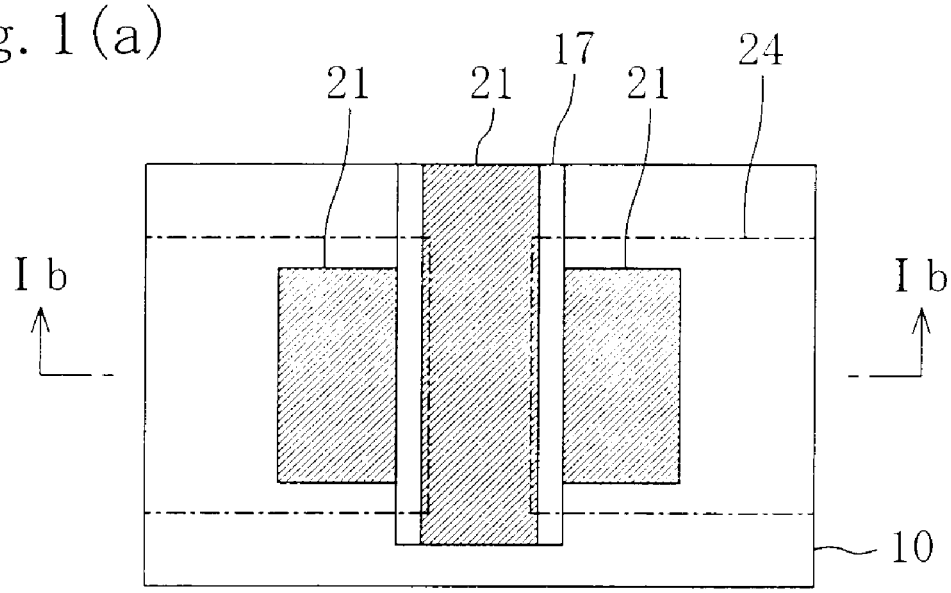
FIG. 1(a) is a diagram for showing the plane structure of a semiconductor device according to Embodiment 1.
Figure 1B:
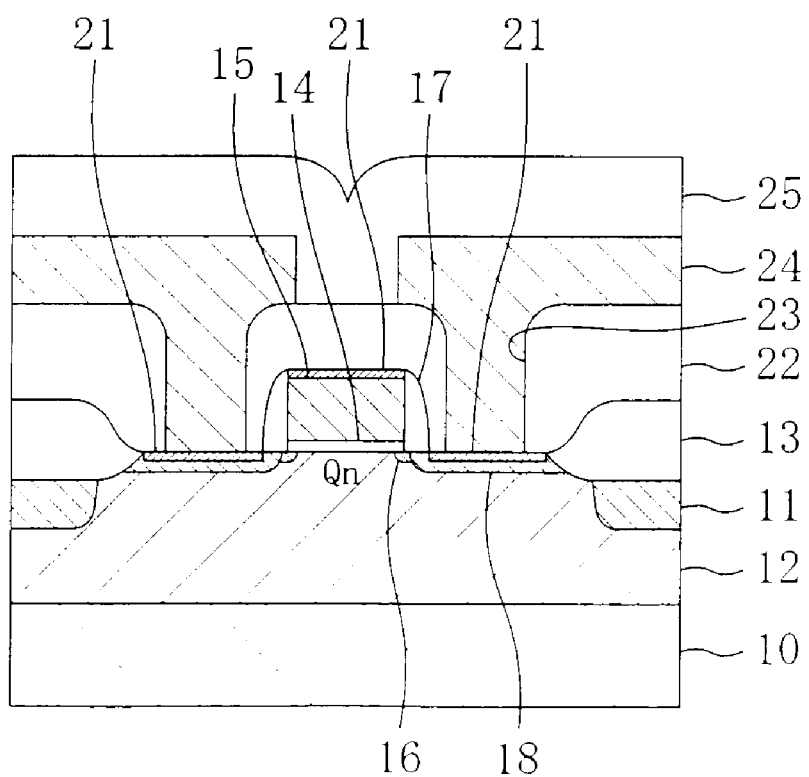
FIG. 1(b) is a cross-sectional view taken on line Ib—Ib of FIG. 1(a).

FIG. 1(a) shows the plane structure of the semiconductor device of Embodiment 1 and FIG. 1(b) shows the cross-sectional structure taken on line Ib—Ib of FIG. 1(a).

The semiconductor device of Embodiment 1 may be any type of transistors including a CMOS transistor, a pMOS transistor and an nMOS transistor, and is herein described as an n-type MOS transistor.

As is shown in FIGS. 1(a) and 1(b), an n-type channel stopper 11 is formed in a surface portion of a semiconductor substrate 10 of n-type silicon crystal having specific resistance of several Ω·cm, a field insulating film 13 serving as an isolation region is formed on the channel stopper 11, and a p-type well region 12 is formed in a portion of the semiconductor substrate 10 surrounded with the channel stopper 11.

In portions to be used as source and drain regions in the p-type well region 12, n-type low concentration impurity diffusion layers 16 and n-type high concentration impurity diffusion layers 18 having the LDD structure are formed. Also, on a portion of the semiconductor substrate 10 sandwiched between the source region and the drain region, a gate electrode 15 of a polysilicon film is formed with a gate insulating film 14 of a silicon oxide film sandwiched therebetween, and a sidewall 17 of a silicon oxide film is formed on the side face of the gate electrode 15.

As a characteristic of Embodiment 1, an epitaxially grown layer of cobalt disilicide ($CoSi_2$) is formed in a surface portion of the n-type high concentration impurity diffusion layer 18, and a polycrystalline cobalt disilicide layer is formed in a surface portion of the gate electrode 15 under conditions the same as those for growing the epitaxially grown layer on the n-type high concentration impurity diffusion layer 18 so as to have an epitaxial relationship with each crystal grain of the polysilicon. The silicide layers formed in the surface portions of the n-type high concentration impurity diffusion layer 18 and the gate electrode 15 have a thickness of, for example, approximately 30 through 50 nm. Therefore, the resistance values of the n-type high concentration impurity diffusion layer 18 and the gate electrode 15 can be sufficiently lowered so as to improve the performance of a semiconductor integrated circuit device including the MOSFET of Embodiment 1.

An interlayer insulating film 22 is deposited on the semiconductor substrate 10, a metal interconnect 24 of, for example, an aluminum alloy film is formed on the interlayer insulating film 22, and the metal interconnect 24 is covered with a protection insulating film 25. The metal interconnect 24 is connected to the epitaxial silicide layer 21 formed in the surface portion of the n-type high concentration impurity diffusion layer 18 through a contact hole 23 formed in the interlayer insulating film 22. Therefore, the contact resistances of the n-type high concentration impurity diffusion layer 18 and the metal interconnect 24 can be sufficiently lowered.

Embodiment 2

A method for fabricating the semiconductor device of Embodiment 1 will now be described as Embodiment 2 of the invention with reference to FIGS. 2(a) through 2(c), 3(a) through 3(c), 4(a) and 4(b).

Figure 2A:
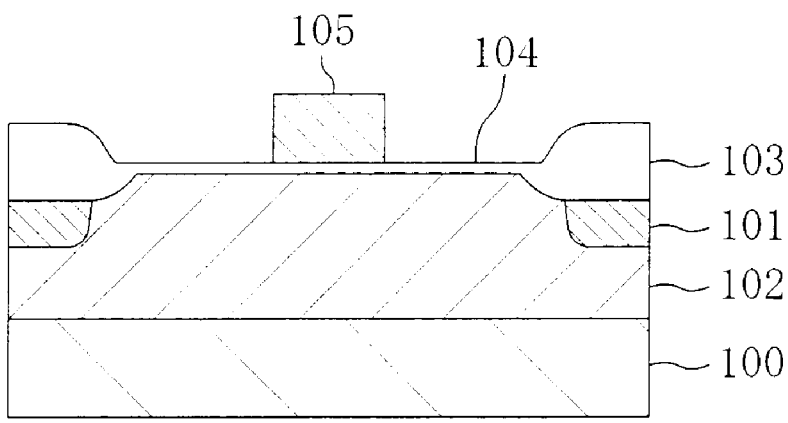
FIGS. 2(a) through 2(c) are cross-sectional views for showing procedures in a method for fabricating a semiconductor device according to Embodiment 2.

First, after forming a silicon oxide film with a small thickness on a semiconductor substrate 100 of n-type silicon crystal shown in FIG. 2(a), a silicon nitride film is deposited on the silicon oxide film. Thereafter, the silicon nitride film is patterned by the known photolithography technique and etching technique, so as to remove a portion of the silicon nitride film corresponding to a field insulating film region.

Next, with the patterned silicon nitride film used as a mask, an n-type impurity such as phosphorus and arsenic is ion implanted into the semiconductor substrate 100 at a high concentration, so as to form a channel stopper 101, and then, a p-type impurity such as boron is ion implanted into the semiconductor substrate 100, so as to form a p-type well region 102. Thereafter, the semiconductor substrate 100 is subjected to LOCOS for oxidizing a surface portion of the semiconductor substrate 100 not covered with the silicon nitride film through annealing, so as to form a field insulating film 103 with a thickness of, for example, 400 nm in the surface portion of the semiconductor substrate 100. The channel stopper 101 and the p-type well region 102 are activated through this annealing. Then, the silicon oxide film and the silicon nitride film are removed.

Next, a gate insulating film 104 of a silicon oxide film with a thickness of, for example, 5 through 10 nm is formed on the entire surface of the semiconductor substrate 100 by, for example, thermal oxidation, a polysilicon film is deposited on the gate insulating film 104 by, for example, CVD, and the polysilicon film is patterned by the known photolithography technique and etching technique into a gate electrode 105.

Figure 2B:
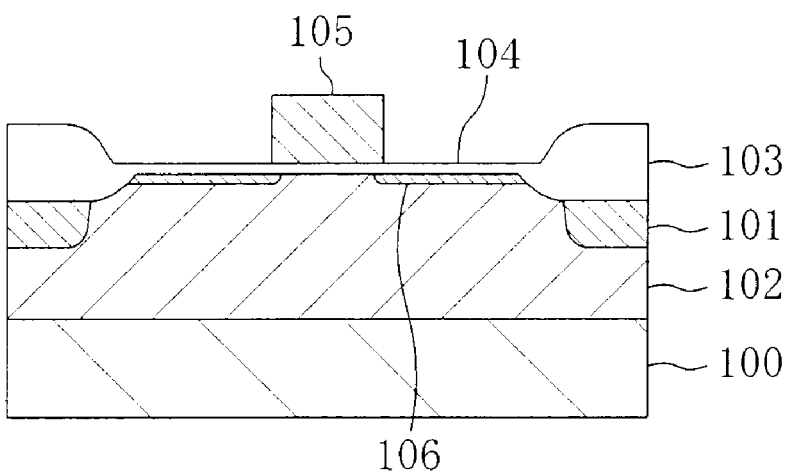

Then, with the gate electrode 105 used as a mask, an n-type impurity such as arsenic and phosphorus is ion implanted into the semiconductor substrate 100 at a low concentration, so as to form an n-type low concentration impurity layer 106 as is shown in FIG. 2(b).

Figure 2C:
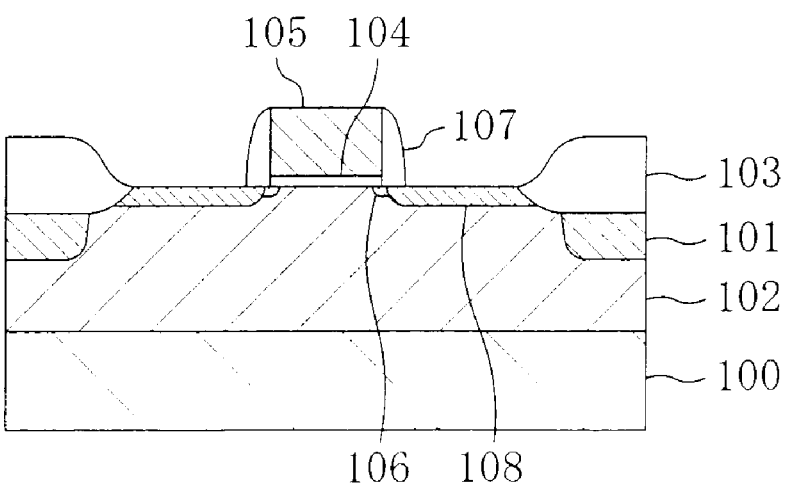

Subsequently, a silicon oxide film is deposited on the entire surface of the semiconductor substrate 100, and the silicon oxide film is subjected to anisotropic etching, so as to form a sidewall 107 on the side face of the gate electrode 105 as is shown in FIG. 2(c). Thereafter, with the gate electrode 105 and the sidewall 107 used as masks, an n-type impurity such as arsenic and phosphorus is ion implanted into the semiconductor substrate 100 at a high concentration, so as to form an n-type high concentration impurity layer 108. Then, the semiconductor substrate 100 is subjected to annealing, so as to active the n-type low concentration impurity layer 106 and the n-type high concentration impurity layer 108.

The sidewall 107 may be formed from a silicon nitride film instead of the silicon oxide film. Also, the annealing for activation may be carried out in first and second rapid thermal annealing processes described below.

Figure 3A:
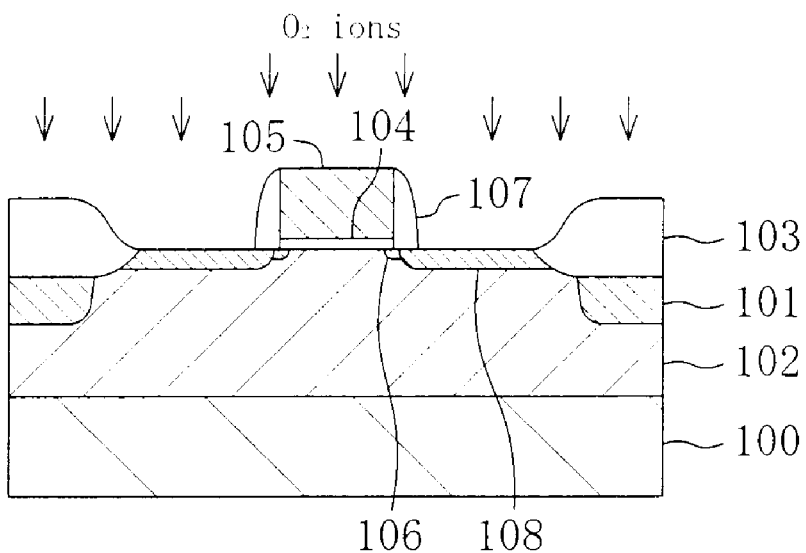
FIGS. 3(a) through 3(c) are cross-sectional views for showing other procedures in the method for fabricating a semiconductor device according to Embodiment 2.
Figure 3B:
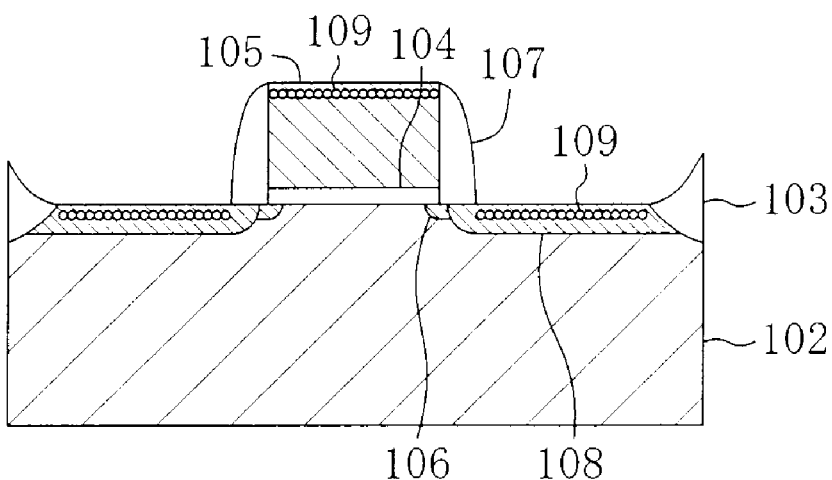

Next, as is shown in FIG. 3(a), nonmetal element ions such as oxygen ions are ion implanted into the semiconductor substrate 100 at low acceleration energy of, for example, 100 through 500 eV, so that an oxygen atom distributed region 109 where oxygen atoms are distributed in a direction along the substrate surface can be formed in the vicinity of the surface of the n-type high concentration impurity layer 108 and in the vicinity of the surface of the gate electrode 105 as is shown in FIG. 3(b). The oxygen atom distributed region 109 may be formed by, instead of the ion implantation of the oxygen ions, plasma doping for distributing oxygen atoms.

The depth for distributing the oxygen atoms of the oxygen atom distributed region 109 is preferably 0.5 through 5 nm from the surface of the n-type high concentration impurity layer 108 or the gate electrode 105, and the concentration of the oxygen atoms included in the oxygen atom distributed region 109 is preferably $4 \times 10^{14}$ cm$^{-2}$ through $4 \times 10^{15}$ cm$^{-2}$. The reasons will be described later.

Figure 3C:
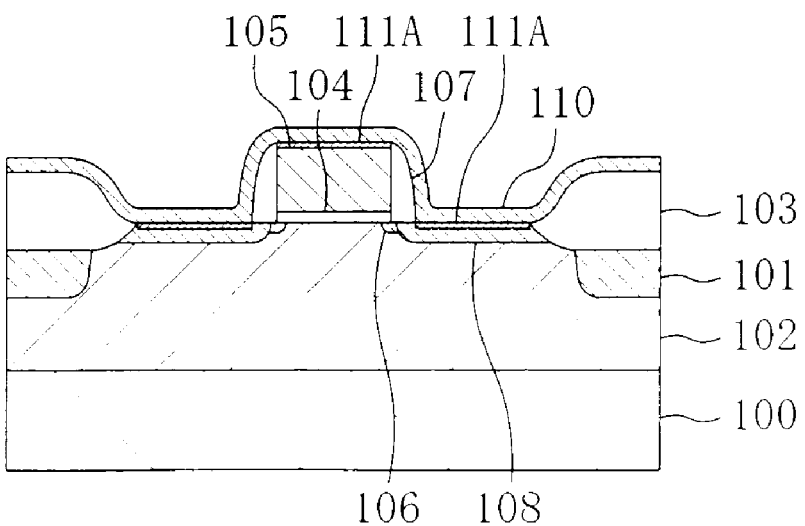

Next, sputtering is carried out in a sputtering system having a chamber kept at a vacuum of $1 \times 10^{-5}$ through $1 \times 10^{-7}$ Pa, so as to deposit a metal film, such as a cobalt film 110, on the entire surface of the semiconductor substrate 100 as is shown in FIG. 3(c).

The oxygen atom distributed region 109 is formed between the cobalt film 110 and the n-type high concentration impurity layer 108 or the gate electrode 105, and the oxygen atoms are distributed in a depth of 0.5 through 5 nm from the surface of the n-type high concentration impurity layer 108 or the gate electrode 105. Therefore, cobalt atoms included in the cobalt film 110 are prevented from diffusing into the semiconductor substrate 100 by the oxygen atom distributed region 109. Also, the crystal lattice of silicon present below the oxygen atom distributed region 109 can be seen from the cobalt atoms included in the cobalt film 110, and hence, even when a region above the oxygen atom distributed region 109 is disturbed by the ion implantation or the plasma doping, the reaction of the cobalt atoms is affected by the crystal structure of a region below the oxygen atom distributed region 109 of the semiconductor substrate 100. Therefore, a nucleus (not shown) of cobalt disilicide (CoSi$_2$) having a lattice constant matching to that of silicon crystal is formed on the interface between the n-type high concentration impurity layer 108 and the cobalt film 110. Furthermore, the gate electrode 105 is formed from polysilicon, and hence, a nucleus of cobalt disilicide (CoSi$_2$) is formed with respect to each crystal grain of the polysilicon in the same manner as in the reaction between the cobalt atoms and the silicon atoms in the n-type high concentration impurity layer 108.

Next, the first rapid thermal annealing (RTA) is carried out for keeping the semiconductor substrate 100 at a temperature of 500° C. for 10 seconds. Thus, the cobalt atoms included in the cobalt film 110 are diffused into the silicon region through the nucleus of cobalt disilicide and react with the silicon atoms. Therefore, as is shown in FIG. 3(c), an epitaxially grown layer (hereinafter referred to as a first epitaxial silicide layer) 111A of cobalt disilicide (CoSi$_2$) corresponding to the crystal structure of the previously formed nucleus of cobalt disilicide is formed in surface portions of the n-type high concentration impurity layer 108 and the gate electrode 105.

In the case where the cobalt film 110 has a thickness of 5 nm, the first epitaxial silicide layer 111A has a thickness of approximately 17 through 18 nm, and in the case where the cobalt film 110 has a thickness of 10 nm, the first epitaxial silicide layer 111A has a thickness of approximately 34 through 36 nm.

Furthermore, in the case where the semiconductor substrate 100 has a face-centered cubic crystal structure, the first epitaxial silicide layer 111A also has a face-centered cubic crystal structure, and in the case where the semiconductor substrate 100 has a diamond or zinc blende crystal structure, the first epitaxial silicide layer 111A has a calcium fluoride (fluorite) crystal structure.

As described above, the oxygen atom distributed region 109 is formed in the regions at the depth of 0.5 through 5 nm from the surface in the vicinity of the surfaces of the n-type high concentration impurity layer 108 and the gate electrode 105, and hence, the cobalt atoms included in the cobalt film 110 are not directly in contact with the silicon atoms included in the n-type high concentration impurity layer 108 or the gate electrode 105. Therefore, the cobalt atoms and the silicon atoms are not reacted with each other too rapidly, so that agglomeration and polycrystallization of the first epitaxial silicide layer 111A can be avoided.

In the case where the concentration of the oxygen atoms included in the oxygen atom distributed region 109 is lower than $4 \times 10^{14}$ cm$^{-2}$, the cobalt atoms and the silicon atoms are too rapidly reacted with each other, so that there can be a fear of the agglomeration or the polycrystallization of the first epitaxial silicide layer 111A. On the other hand, in the case where the concentration of the oxygen atoms is higher than $4 \times 10^{15}$ cm$^{-2}$, a distance between the cobalt atoms and the crystal lattice of the semiconductor substrate 100 becomes too large to satisfactorily cause the reaction between the cobalt atoms and the silicon atoms. Accordingly, the concentration of the oxygen atoms included in the oxygen atom distributed region 109 is preferably $4 \times 10^{14}$ cm$^{-2}$ through $4 \times 10^{15}$ cm$^{-2}$.

In the first epitaxial silicide layer 111A, all layers may be formed from cobalt disilicide (CoSi$_2$), or the lowermost layer (closer to the silicon layer) may be formed from cobalt disilicide (CoSi$_2$) with the uppermost layer (closer to the cobalt film 110) formed from cobalt silicide (CoSi). In the first epitaxial silicide layer 111A of Embodiment 2, the lowermost layer is formed from cobalt disilicide and the uppermost layer is formed from cobalt silicide. When a cobalt disilicide layer is formed at least on the interface with the silicon layer, the agglomeration of the cobalt silicide layer can be avoided, resulting in reducing a leakage current.

Figure 4A:
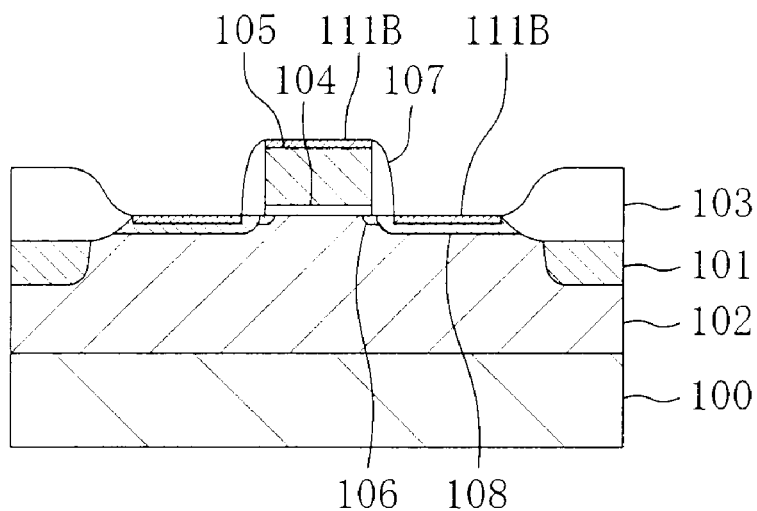
FIGS. 4(a) and 4(b) are cross-sectional views for showing still other procedures in the method for fabricating a semiconductor device according to Embodiment 2.

Next, as is shown in FIG. 4(a), a portion of the cobalt film 110 not reacted in the first rapid thermal annealing is removed by using an etchant of, for example, a mixture of an ammonia solution and hydrogen peroxide or a mixed acid solution including hydrochloric acid. Thereafter, the second rapid thermal annealing (RTA) is carried out for keeping the semiconductor substrate 100 at a temperature of 800° C. for 10 seconds. Thus, the cobalt silicide included in the uppermost layer of the first epitaxial silicide layer 111A is also grown to cobalt disilicide, and hence, the first epitaxial silicide layer 111A is changed into a second epitaxial silicide layer 111B in which all layers are formed from cobalt disilicide.

In the case where all the layers of the first epitaxial silicide layer 111A are formed from cobalt disilicide ($CoSi_2$), the second rapid thermal annealing can be omitted. In this case, the second epitaxial silicide layer 111B mentioned in the following description is read as the first epitaxial silicide layer 111A.

Figure 4B:
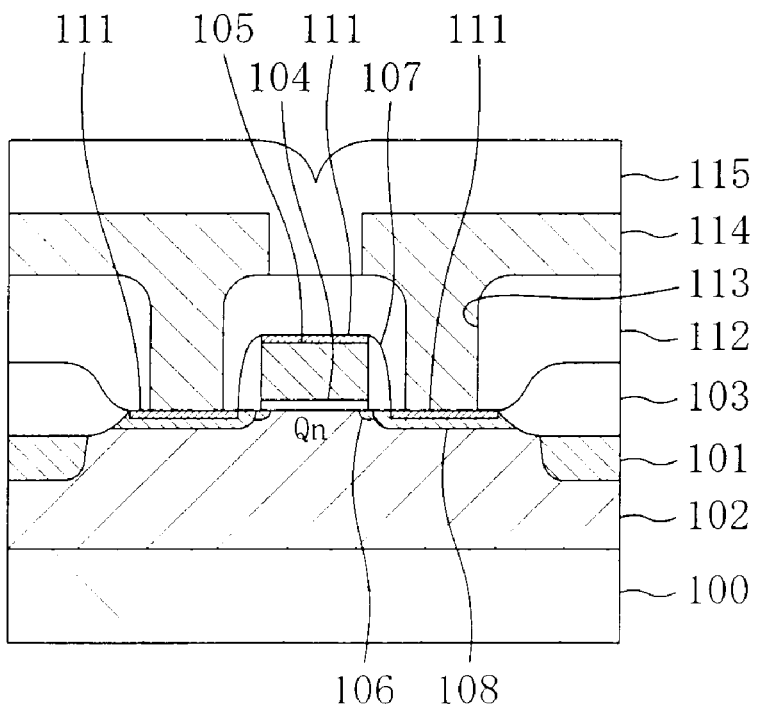

Next, as is shown in FIG. 4(b), an interlayer insulating film 112 of a silicon oxide film is deposited on the entire surface of the semiconductor substrate 100 by the CVD using, for example, TEOS (tetraethoxysilane), and a contact hole 113 is formed in the interlayer insulating film 112 by the known photolithography technique and etching technique.

Then, for example, an aluminum alloy film is deposited on the entire surface of the semiconductor substrate 100 so as to fill the contact hole 113 by, for example, the sputtering, and the aluminum alloy film is patterned by the known photolithography technique and etching technique into a metal interconnect 114. Thereafter, a protection insulating film 115 of a multi-layer film including, for example, a silicon oxide film and a silicon nitride film is deposited on the metal interconnect 114 by, for example, plasma CVD. Thus, the semiconductor device of Embodiment 1 is completed.

The metal interconnect 114 may be formed from, instead of the aluminum alloy film, a multi-layer film including an aluminum alloy film and a titanium nitride film or tungsten film.

According to Embodiment 2, the second epitaxial silicide layer 111B of cobalt disilicide is formed in the surface portions of the n-type high concentration impurity layer 108 and the gate electrode 105. Therefore, the sheet resistance of the n-type high concentration impurity layer 108 and the gate electrode 105 can be lowered to approximately 5 $\Omega/\square$, which is much lower than the sheet resistance (of 100 $\Omega/\square$) obtained without forming the second epitaxial silicide layer 111B. In addition, the contact resistance can be also lowered, so that the performance of a semiconductor integrated circuit device including the MOSFET can be improved.

Furthermore, according to Embodiment 2, the metal film such as the cobalt film 110 is deposited after distributing the nonmetal element such as the oxygen atoms 109 in the regions in the vicinity of the surfaces of the n-type high concentration impurity layer 108 and the gate electrode 105, and thereafter, the first and second rapid thermal annealing are carried out so as to form the second epitaxial silicide layer 111B of cobalt disilicide in the surface portions of the n-type high concentration impurity layer 108 and the gate electrode 105. Accordingly, the cobalt atoms and the silicon atoms are prevented from too rapidly reacting with each other, so that the agglomeration and the polycrystallization of the second epitaxial silicide layer 111B can be avoided and that a spike defect can be prevented from being caused in the second epitaxial silicide layer 111B. As a result, disconnection derived from the agglomeration or the polycrystallization of the epitaxial silicide layer can be prevented as well as junction leakage derived from a spike defect can be prevented.

Moreover, according to Embodiment 2, with the oxygen atoms 109 distributed in the regions in the vicinity of the surfaces of the n-type high concentration impurity layer 108 and the gate electrode 105, namely, with the oxygen atoms 109 present at a low concentration between the n-type high concentration impurity layer 108 or the gate electrode 105 and the cobalt film 110, the first rapid thermal annealing is carried out. Therefore, the first rapid thermal annealing can be carried out at a low temperature of, for example, 500° C.

Although the second epitaxial silicide layer 111B of cobalt disilicide is formed in the surface portions of both the n-type high concentration impurity layer 108 and the gate electrode 105 in Embodiment 2, the second epitaxial silicide layer 111B may be formed in the surface portion of either the n-type high concentration impurity layer 108 or the gate electrode 105 instead.

Although the oxygen atoms are distributed as the nonmetal element in the regions in the vicinity of the surfaces of the n-type high concentration impurity layer 108 and the gate electrode 105 in Embodiment 2, nitrogen atoms or fluorine atoms may be distributed instead of the oxygen atoms.

Although the cobalt film 110 is deposited as the metal film so as to form the second epitaxial silicide layer 111B of cobalt disilicide in Embodiment 2, a metal film of another transition metal such as nickel and iron may be deposited instead of the cobalt film 110, so as to form an epitaxial silicide layer from the transition metal included in the metal film and silicon.

Embodiment 3

Another method for fabricating the semiconductor device of Embodiment 1 will now be described as Embodiment 3 of the invention with reference to FIGS. 5(a) through 5(c), 6(a) through 6(c), 7(a) and 7(b).

Figure 5A:
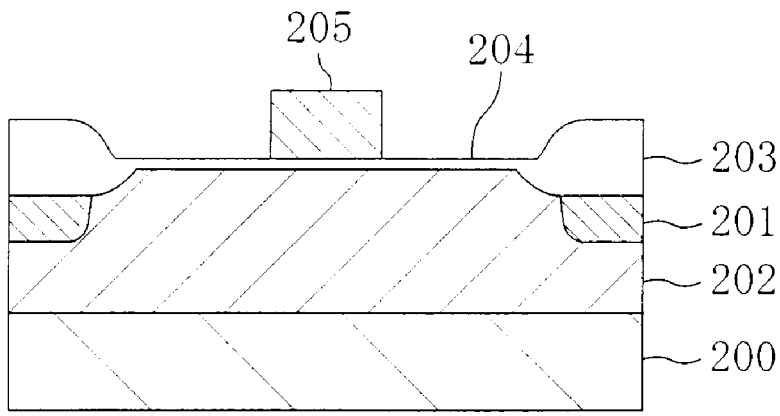
FIGS. 5(a) through 5(c) are cross-sectional views for showing procedures in a method for fabricating a semiconductor device according to Embodiment 3.

First, as is shown in FIG. 5(a), in the same manner as in Embodiment 2, a p-type well region 202 is formed by ion implanting a p-type impurity such as boron into a semiconductor substrate 200 of n-type silicon crystal, and then, a field insulating film 203 with a thickness of, for example, 400 nm is formed in a surface portion of the semiconductor substrate 200 by the LOCOS. Subsequently, after a gate insulating film 204 of a silicon oxide film with a thickness of, for example, 5 through 10 nm is formed on the entire surface of the semiconductor substrate 200, a polysilicon film is deposited on the gate insulating film 204 by, for example, the CVD, and the polysilicon film is patterned into a gate electrode 205.

Figure 5B:
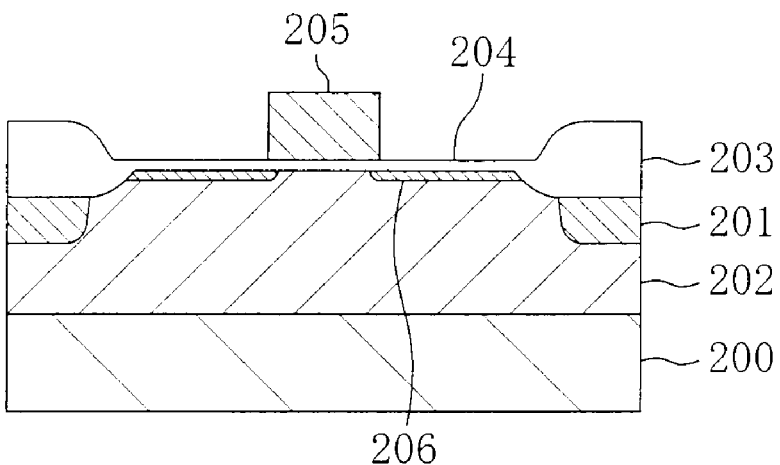

Next, with the gate electrode 205 used as a mask, an n-type impurity such as arsenic and phosphorus is ion implanted into the semiconductor substrate 200 at a low concentration, so as to form an n-type low concentration impurity layer 206 as is shown in FIG. 5(b).

Figure 5C:
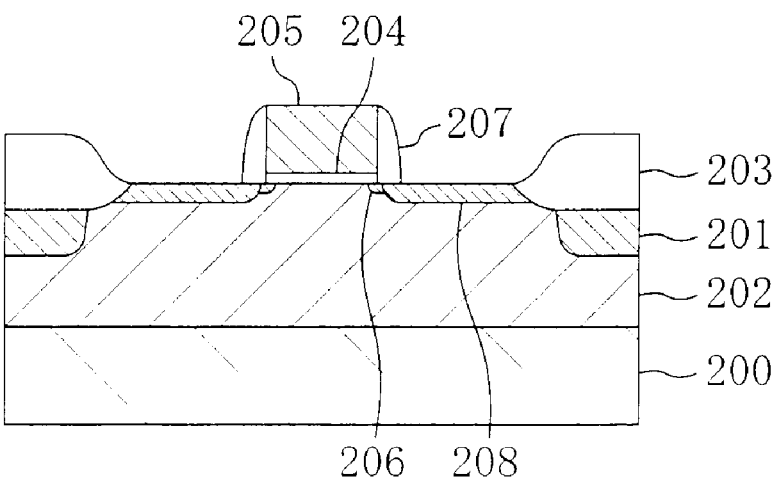

Then, a silicon oxide film is deposited on the entire surface of the semiconductor substrate 200, and the silicon oxide film is subjected to the anisotropic etching, so as to form a sidewall 207 on the side face of the gate electrode 205 as is shown in FIG. 5(c). Thereafter, with the gate electrode 205 and the sidewall 207 used as masks, an n-type impurity such as arsenic and phosphorus is ion implanted into the semiconductor substrate 200 at a high concentration, so as to form an n-type high concentration impurity layer 208. Then, the semiconductor substrate 200 is subjected to annealing, thereby activating the n-type low concentration impurity layer 206 and the n-type high concentration impurity layer 208.

Figure 6A:
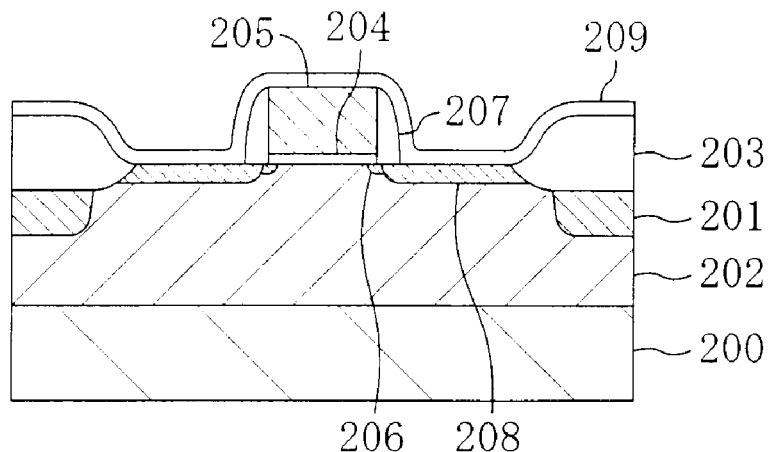
FIGS. 6(a) through 6(c) are cross-sectional views for showing other procedures in the method for fabricating a semiconductor device according to Embodiment 3.

Then, as is shown in FIG. 6(a), a compound layer of a semiconductor element and a nonmetal film, such as a silicon oxide film 209, with a thickness of approximately 10 nm is formed on the entire surface of the semiconductor substrate 200.

The silicon oxide film 209 may be formed by any of the following methods: In the first method, a solution with oxidizing power (such as a mixed solution of ammonia, hydrogen peroxide and pure water) is supplied onto the surface of the semiconductor substrate 200, thereby forming the so-called chemical oxide ($SiO_2$) film; in the second method, the semiconductor substrate 200 is exposed to oxygen plasma, thereby forming a silicon oxide film with a thickness of approximately 10 nm; and in the third method, the semiconductor substrate 200 is heated to 750 through 900° C. in an oxidizing atmosphere, thereby forming a thermally oxidized film with a thickness of approximately 10 nm.

Figure 6B:
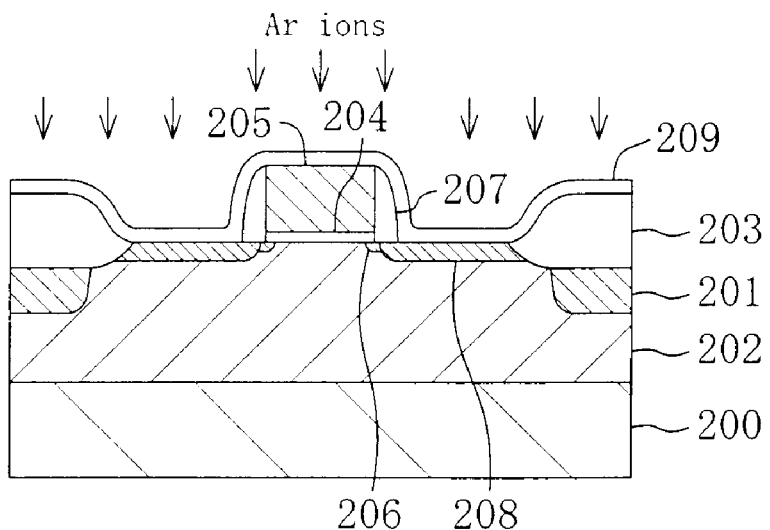
Figure 6C:
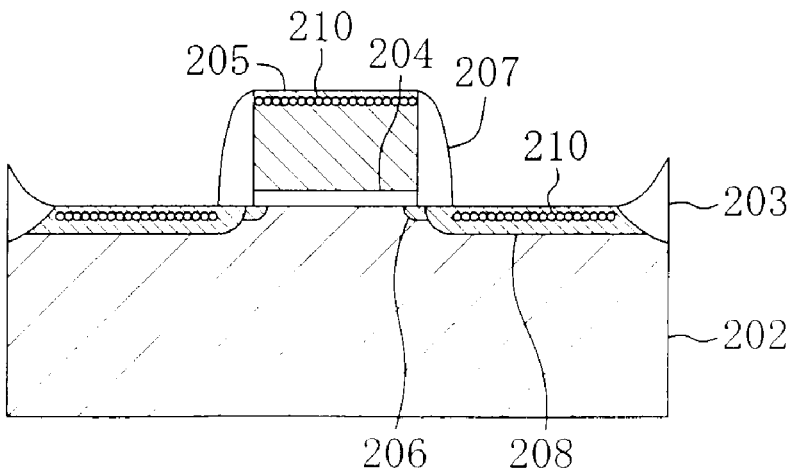

Next, as is shown in FIG. 6(b), the silicon oxide film 209 is irradiated with a particle energy beam including a non-metal element, such as an Ar ion beam, at low energy. In this manner, owing to recoil of the particle energy beam, oxygen atoms included in the silicon oxide film 209 are distributed in a direction along the substrate surface in regions in the vicinity of the surfaces of the n-type high concentration impurity layer 208 and the gate electrode 205, so as to form an oxygen atom distributed region 210 as is shown in FIG. 6(c). In this case, the oxygen atoms included in the silicon oxide film 209 may be sputtered through the irradiation with the particle energy beam.

Also, the depth for distributing the oxygen atoms of the oxygen atom distributed region 210 is preferably 0.5 through 5 nm from the surface of the n-type high concentration impurity layer 208 or the gate electrode 205, and the concentration of the oxygen atoms in the oxygen atom distributed region 210 is preferably $4 \times 10^{14}$ $cm^{-2}$ through $4 \times 10^{15}$ $cm^{-2}$. The reasons are the same as those described in Embodiment 2.

In the case where Ar ions are used for the irradiation of the particle energy beam, the peak of the distribution of the oxygen atoms in the oxygen atom distributed region 210 is at a depth of 1 nm from the surface of the silicon region when the acceleration energy of the Ar ions is 100 eV, and the peak of the distribution of the oxygen atoms is at a depth of 2 nm from the surface of the silicon region when the acceleration energy of the Ar ions is 300 eV.

Next, as is shown in FIG. 79a), after removing the silicon oxide film 209, the sputtering is carried out in a sputtering system having a chamber kept at a degree of vacuum of $1 \times 10^{-5}$ through $1 \times 10^{-7}$ Pa, thereby depositing a metal film, such as a cobalt film 211, on the entire surface of the semiconductor substrate 200. In this manner, similarly to Embodiment 2, cobalt atoms included in the cobalt film 211 are incorporated into the crystal lattice of silicon. Therefore, a nucleus of cobalt disilicide ($CoSi_2$) is formed on the interface between the n-type high concentration impurity layer 208 and the cobalt film 210, and a nucleus of cobalt disilicide ($CoSi_2$) is formed with respect to each crystal grain of the gate electrode 205.

Then, first rapid thermal annealing (RTA) is carried out for keeping the semiconductor substrate 200 at a temperature of 500° C. for 10 seconds, so as to form a first epitaxial silicide layer 212A in surface portions of the n-type high concentration impurity layer 208 and the gate electrode 205.

Since the oxygen atom distributed region 210 is formed in the regions at the depth of 0.5 through 5 nm from the surface in the vicinity of the surfaces of the n-type high concentration impurity layer 208 and the gate electrode 205 in Embodiment 3, the cobalt atoms and the silicon atoms are not too rapidly reacted with each other. Therefore, the agglomeration or polycrystallization of the first epitaxial silicide layer 212A can be avoided.

Now, a measurement result of the concentration of the oxygen atoms in the oxygen atom distributed region 210 will be described.

Figure 8:
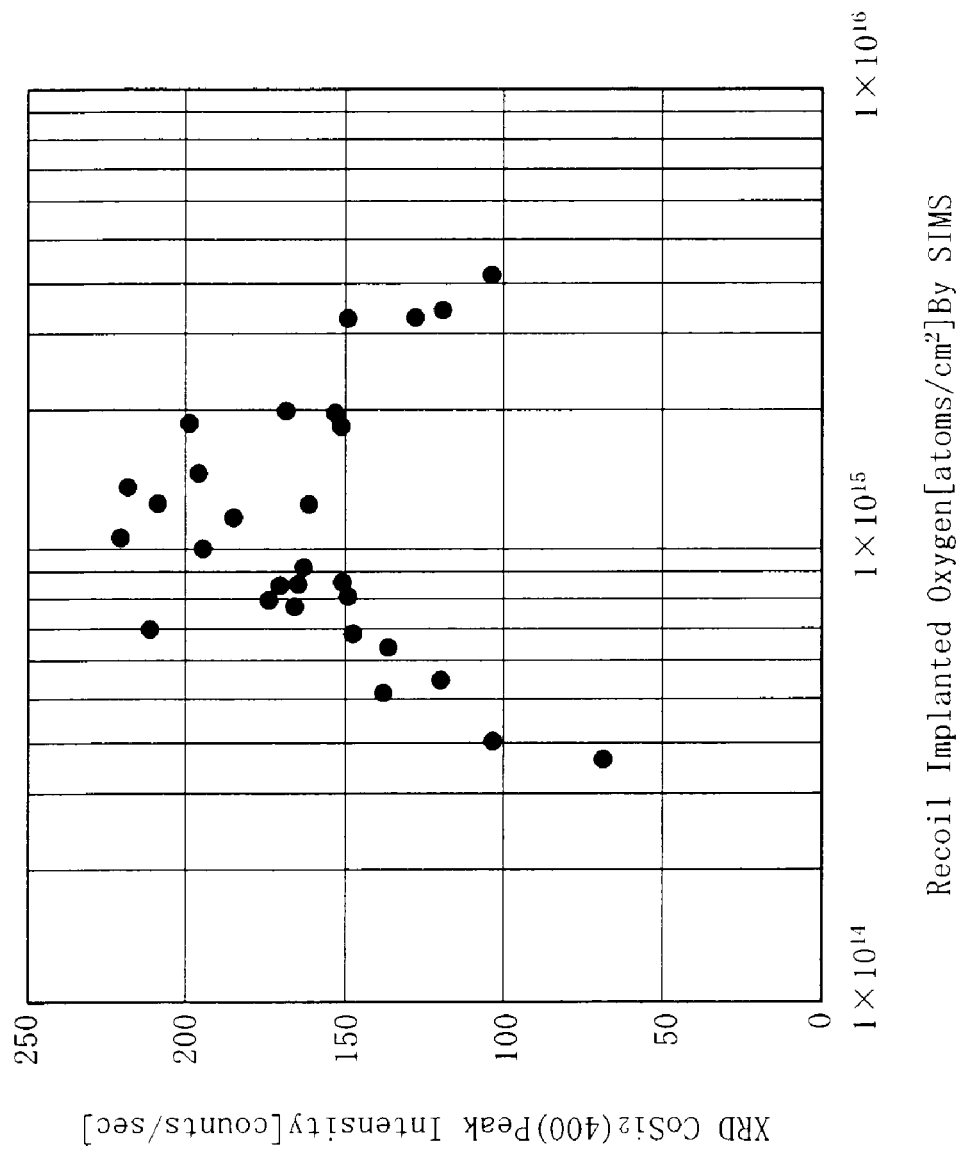
FIG. 8 is a characteristic diagram for showing the relationship between an oxygen concentration and the degree of epitaxial growth obtained by measuring the concentration of oxygen atoms by low energy SIMS.

FIG. 8 shows the result obtained by measuring the concentration of the oxygen atoms by low energy SIMS, in which the abscissa indicates the oxygen concentration (unit: number of atoms/$cm^2$) and the ordinate indicates the degree of epitaxial growth. The degree of epitaxial growth can be expressed by intensity, and as the value of intensity is larger, the degree of epitaxial growth is larger. In this case, the ordinate indicates the peak intensity of $CoSi_2$ (400).

It is understood from the data shown in FIG. 8 at what concentration oxygen should be distributed in the vicinity of the surface of the semiconductor substrate 200 for forming the first epitaxial silicide layer 212A of cobalt disilicide ($CoSi_2$). Also, it is understood from FIG. 8 that cobalt disilicide can be epitaxially grown practically without causing a problem of heat resistance when the value on the ordinate is larger than 100. Specifically, as far as the value on the ordinate is larger than 100, cobalt disilicide can attain heat resistance against a high temperature of approximately 800° C., so as to avoid the agglomeration at a high temperature. The value on the ordinate is larger than 100 when the concentration of oxygen is $4 \times 10^{14}$ $cm^{-2}$ through $4 \times 10^{15}$ $cm^{-2}$.

Accordingly, when the concentration of the oxygen atoms in the oxygen atom distributed region 210 is controlled to be $4 \times 10^{14}$ $cm^{-2}$ through $4 \times 10^{15}$ $cm^{-2}$, the first epitaxial silicide layer 212A can be satisfactorily grown without causing the agglomeration of cobalt disilicide ($CoSi_2$).

In the first epitaxial silicide layer 212A, all layers may be formed from cobalt disilicide ($CoSi_2$), or the lowermost layer (closer to the silicon layer) may be formed from cobalt disilicide ($CoSi_2$) with the uppermost layer (closer to the cobalt film 110) formed from cobalt silicide (CoSi). In this manner, the agglomeration of the cobalt silicide layer can be prevented, resulting in reducing a leakage current.

Figure 7A:
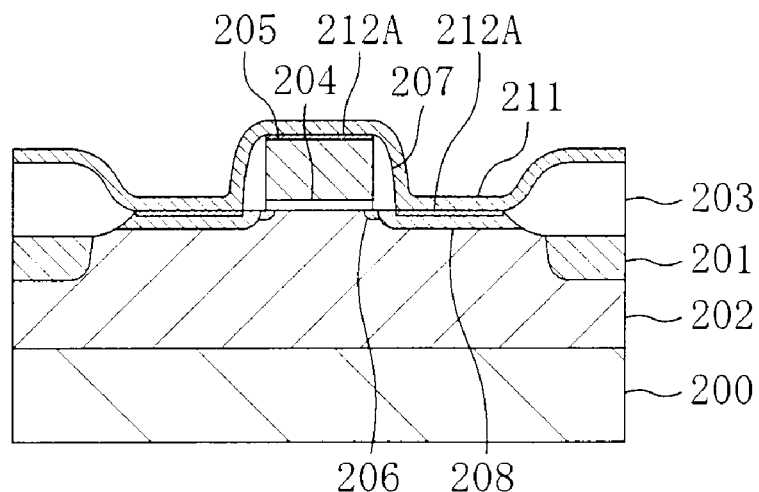
FIGS. 7(a) and 7(b) are cross-sectional views for showing still other procedures in the method for fabricating a semiconductor device according to Embodiment 3.
Figure 7B:
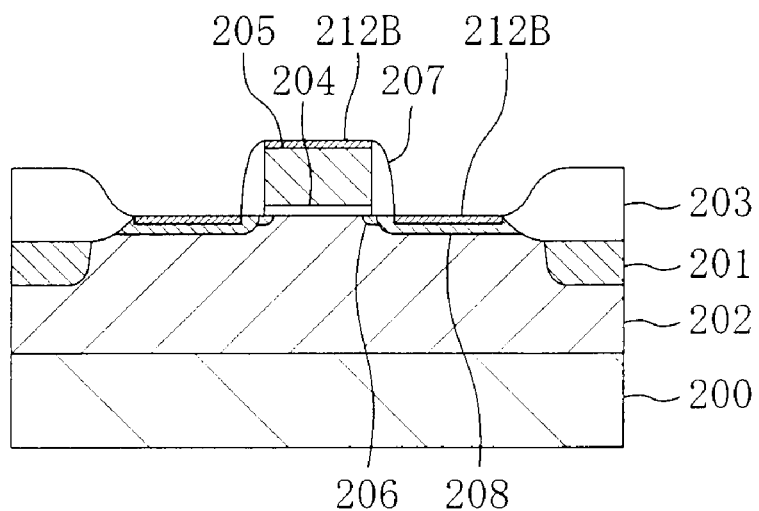

Next, as is shown in FIG. 7(b), a portion of the cobalt film 211 not reacted in the first rapid thermal annealing is removed by using an etchant of, for example, a mixture of an ammonia solution and hydrogen peroxide or a mixed acid solution including hydrochloric acid. Thereafter, second rapid thermal annealing (RTA) is carried out for keeping the semiconductor substrate 200 at a temperature of 800° C. for 10 seconds. Thus, the first epitaxial silicide layer 212A is changed into a second epitaxial silicide layer 212B in which all layers are formed from cobalt disilicide.

In the case where all the layers of the first epitaxial silicide layer 212A are formed from cobalt disilicide, the second rapid thermal annealing can be omitted. In this case, the second epitaxial silicide layer 212B mentioned in the following description is read as the first epitaxial silicide layer 212A.

Thereafter, although not shown in the drawings, an interlayer insulating film, a contact hole, a metal interconnect and a protection insulating film are formed in the same manner as in Embodiment 2. Thus, the semiconductor device of Embodiment 1 is completed.

According to Embodiment 3, the second epitaxial silicide layer 212B of cobalt disilicide is formed in the surface portions of the n-type high concentration impurity layer 208 and the gate electrode 205. Therefore, the sheet resistance of the n-type high concentration impurity layer 208 and the gate electrode 205 can be lowered to approximately 5 Ω/□, and the contact resistance can be also lowered. As a result, the performance of a semiconductor integrated circuit device including the MOSFET can be improved.

Also, according to Embodiment 3, the particle energy beam is irradiated after depositing the silicon oxide film 209 on the semiconductor substrate 200. Therefore, the oxygen atoms 210 included in the silicon oxide film 209 can be definitely distributed in the regions in the vicinity of the surfaces of the n-type high concentration impurity layer 208 and the gate electrode 205.

Furthermore, the metal film such as the cobalt film 211 is deposited after the nonmetal element such as the oxygen atoms 210 is distributed in the regions in the vicinity of the surfaces of the n-type high concentration impurity layer 208 and the gate electrode 205, and then, the first and second rapid thermal annealing are carried out so as to form the second epitaxial silicide layer 212B of cobalt disilicide in the surface portions of the n-type high concentration impurity layer 208 and the gate electrode 205. Therefore, the cobalt atoms and the silicon atoms are prevented from too rapidly reacting with each other. As a result, the agglomeration or polycrystallization of the second epitaxial silicide layer 212B can be avoided as well as a spike defect can be prevented from being caused in the second epitaxial silicide layer 212B. In this manner, the disconnection derived from the agglomeration or polycrystallization of the epitaxial silicide layer can be prevented as well as the junction leakage derived from a spike defect can be prevented.

Moreover, according to Embodiment 3, the first rapid thermal annealing is carried out with the oxygen atoms 210 distributed in the regions in the vicinity of the surfaces of the n-type high concentration impurity layer 208 and the gate electrode 205. Therefore, the first rapid thermal annealing can be carried out at a low temperature such as 500° C.

Although the second epitaxial silicide layer 212B of cobalt disilicide is formed in the surface portions of both the n-type high concentration impurity layer 208 and the gate electrode 205 in Embodiment 3, the second epitaxial silicide layer 212B may be formed in the surface portion of either the n-type high concentration impurity layer 208 or the gate electrode 205 instead.

Although the silicon oxide film 209 is formed on the semiconductor substrate 200 in Embodiment 3, a silicon nitride film or a silicon fluoride film may be deposited instead, so that nitrogen atoms or fluorine atoms can be distributed in the regions in the vicinity of the surfaces of the n-type high concentration impurity layer 208 and the gate electrode 205.

Although the cobalt film 211 is deposited as the metal film so as to form the second epitaxial silicide layer 212B of cobalt disilicide in Embodiment 3, a metal film of another transition metal such as nickel and iron may be deposited instead of the cobalt film 211, so as to form an epitaxial silicide layer from the transition metal included in the metal film and silicon.

Modification of Embodiment 3

In Embodiment 3, the silicon oxide film 209 is removed after distributing the oxygen atoms 210 in the regions in the vicinity of the surfaces of the n-type high concentration impurity layer 208 and the gate electrode 205 by irradiating the silicon oxide film 209 with the particle energy beam including a nonmetal element such as the Ar ions. In contrast, in a modification of Embodiment 3, the mass and the energy of the particles included the particle energy beam, such as the Ar ions, are controlled, so that the silicon oxide film 209 can be removed through the irradiation with the particle energy beam in distributing the oxygen atoms 210 in the regions in the vicinity of the surfaces of the n-type high concentration impurity layer 208 and the gate electrode 205. In this manner, the procedure for removing the silicon oxide film 209 can be omitted.

INDUSTRIAL APPLICABILITY

According to first or second method for fabricating a semiconductor device of this invention, rapid thermal annealing is carried out with a nonmetal element distributed in a region in the vicinity of the surface of a semiconductor layer, so as to cause a reaction between an element included in the semiconductor layer and a metal included in a metal film. Therefore, the metal included in the metal film and the element included in the semiconductor layer can be prevented from too rapidly reacting with each other. Accordingly, polycrystallization of an epitaxially grown semiconductor-metal compound layer can be avoided.

As a result, according to the invention, an epitaxially grown semiconductor-metal compound layer free from agglomeration and a spike defect can be stably formed at a degree of vacuum generally employed in the semiconductor mass production process and at a low temperature.

What is claimed is:

1. A method for fabricating a semiconductor device comprising the steps of:
   (a) forming a compound layer including a semiconductor element and a nonmetal element on a semiconductor layer;
   (b) distributing said nonmetal element included in said compound layer in the region in the vicinity of the surface portion of said semiconductor layer through recoil by irradiating said compound layer with a particle energy beam;
   (c) after the step (b), removing said compound layer;
   (d) after the step (c), depositing a metal film on said semiconductor layer; and
   (e) after the step (d), epitaxially growing a semiconductor-metal compound layer in the surface portion of said semiconductor layer by causing a reaction between an element included in said semiconductor layer and a metal included in said metal film through annealing carried out on said metal film,
   wherein said region in the vicinity of the surface portion of said semiconductor layer is within a depth of 0.5 nm to 5 nm from the surface of the semiconductor layer, and
   a dosage of said nonmetal element per unit area is between $4 \times 10^{14}$ cm$^{-2}$ and $4 \times 10^{15}$ cm$^{-2}$.

2. A method for fabricating a semiconductor device comprising the steps of:
   (a) forming a compound layer including a semiconductor element and a nonmetal element on a semiconductor layer;
   (b) distributing said nonmetal element included in said compound layer in the region in the vicinity of the surface portion of said semiconductor layer through recoil and removing said compound layer by irradiating said compound layer with a particle energy beam;
   (c) after the step (b), depositing a metal film on said semiconductor layer; and
   (d) after the step (c), epitaxially growing a semiconductor-metal compound layer in the surface portion of said semiconductor layer by causing a reaction between an element included in said semiconductor layer and a metal included in said metal film through annealing carried out on said metal film,
   wherein said region in the vicinity of the surface portion of said semiconductor layer is within a depth of 0.5 nm to 5 nm from the surface of the semiconductor layer, and a dosage of said nonmetal element per unit area is between $4\times10^{14}$ cm$^{-2}$ and $4\times10^{15}$ cm$^{-2}$.

3. A method for fabricating a semiconductor device comprising the steps of:

distributing an oxygen element in a region in the vicinity of a surface portion of a semiconductor layer;

depositing a metal film on said semiconductor layer; and epitaxially growing a semiconductor-metal compound layer in the surface portion of said semiconductor layer by causing a reaction between an element included in said semiconductor layer and a metal included in said metal film through annealing carried out on said metal film;

wherein said region in the vicinity of the surface portion of said semiconductor layer is within a depth of 0.5 nm to 5 nm from the surface of the semiconductor layer; and a dosage of said nonmetal element per unit area is between $4\times10^{14}$ cm$^{-2}$ and $4\times10^{15}$ cm$^{-2}$.

4. A method for fabricating a semiconductor device comprising the steps of:

distributing an oxygen element in a region in the vicinity of a surface portion of a semiconductor layer;

depositing a metal film on said semiconductor layer; and epitaxially growing a semiconductor-metal compound layer in the surface portion of said semiconductor layer by causing a reaction between an element included in said semiconductor layer and a metal included in said metal film through annealing carried out on said metal film;

wherein said region in the vicinity of the surface portion of said semiconductor layer is within a depth of 0.5 nm to 5 nm from the surface of the semiconductor layer, and a distribution of said nonmetal element per unit area is between $4\times10^{14}$ cm$^{-2}$ and $4\times10^{15}$ cm$^{-2}$.

5. A method for fabricating a semiconductor device comprising the steps of:

distributing an oxygen element in a region in the vicinity of a surface portion of a semiconductor layer;

depositing a metal film on said semiconductor layer; and epitaxially growing a semiconductor-metal compound layer in the surface portion of said semiconductor layer by causing a reaction between an element included in said semiconductor layer and a metal included in said metal film through annealing carried out on said metal film;

wherein said region in the vicinity of the surface portion of said semiconductor layer is within a depth of 0.5 nm to 5 nm from the surface of the semiconductor layer, and a concentration of said nonmetal element per unit area is between $4\times10^{14}$ cm$^{-2}$ and $4\times10^{15}$ cm$^{-2}$.

6. The method for fabricating a semiconductor device of claim 3, 4 or 5, wherein said semiconductor layer is a silicon layer, said metal film is a cobalt film, and said semiconductor-metal compound layer is a cobalt silicide layer.

7. A method for fabricating a semiconductor device comprising the steps of:

(a) forming a compound layer including a semiconductor element and a nonmetal element on a semiconductor layer;

(b) distributing said nonmetal element included in said compound layer in the region in the vicinity of the surface portion of said semiconductor layer through recoil by irradiating said compound layer with a particle energy beam;

(c) after the step (b), removing said compound layer;

(d) after the step (c), depositing a metal film on said semiconductor layer; and (e) after the step (d), epitaxially growing a semiconductor-metal compound layer in the surface portion of said semiconductor layer by causing a reaction between an element included in said semiconductor layer and a metal included in said metal film through annealing carried out on said metal film, wherein said region in the vicinity of the surface portion of said semiconductor layer is within a depth of 0.5 nm to 5 nm from the surface of the semiconductor layer, and a distribution of said nonmetal element per unit area is between $4\times10^{14}$ cm$^{-2}$ and $4\times10^{15}$ cm$^{-2}$.

8. A method for fabricating a semiconductor device comprising the steps of:

(a) forming a compound layer including a semiconductor element and a nonmetal element on a semiconductor layer;

(b) distributing said nonmetal element included in said compound layer in the region in the vicinity of the surface portion of said semiconductor layer through recoil by irradiating said compound layer with a particle energy beam;

(c) after the step (b), removing said compound layer;

(d) after the step (c), depositing a metal film on said semiconductor layer; and (e) after the step (d), epitaxially growing a semiconductor-metal compound layer in the surface portion of said semiconductor layer by causing a reaction between an element included in said semiconductor layer and a metal included in said metal film through annealing carried out on said metal film, wherein said region in the vicinity of the surface portion of said semiconductor layer is within a depth of 0.5 nm to 5 nm from the surface of the semiconductor layer, and a concentration of said nonmetal element per unit area is between $4\times10^{14}$ cm$^{-2}$ and $4\times10^{15}$ cm$^{-2}$.

9. A method for fabricating a semiconductor device comprising the steps of:

(a) forming a compound layer including a semiconductor element and a nonmetal element on a semiconductor layer;

(b) distributing said nonmetal element included in said compound layer in the region in the vicinity of the surface portion of said semiconductor layer through recoil and removing said compound layer by irradiating said compound layer with a particle energy beam;

(c) after the step (b), depositing a metal film on said semiconductor layer; and (d) after the step (c), epitaxially growing a semiconductor-metal compound layer in the surface portion of said semiconductor layer by causing a reaction between an element included in said semiconductor layer and a metal included in said metal film through annealing carried out on said metal film, wherein said region in the vicinity of the surface portion of said semiconductor layer is within a depth of 0.5 nm to 5 nm from the surface of the semiconductor layer, and a distribution of said nonmetal element per unit area is between $4\times10^{14}$ cm$^{-2}$ and $4\times10^{15}$ cm$^{-2}$.

10. A method for fabricating a semiconductor device comprising the steps of:

(a) forming a compound layer including a semiconductor element and a nonmetal element on a semiconductor layer;

(b) distributing said nonmetal element included in said compound layer in the region in the vicinity of the surface portion of said semiconductor layer through recoil and removing said compound layer by irradiating said compound layer with a particle energy beam;

(c) after the step (b), depositing a metal film on said semiconductor layer; and (d) after the step (c), epitaxially growing a semiconductor-metal compound layer in the surface portion of said semiconductor layer by causing a reaction between an element included in said semiconductor layer and a metal included in said metal film through annealing carried out on said metal film, wherein said region in the vicinity of the surface portion of said semiconductor layer is within a depth of 0.5 nm to 5 nm from the surface of the semiconductor layer, and a concentration of said nonmetal element per unit area is between $4\times10^{14}$ cm$^{-2}$ and $4\times10^{15}$ cm$^{-2}$.

11. The method for fabricating a semiconductor device of claim 1, 2, 7, 8, 9 or 10, wherein said semiconductor layer has a face-centered cubic crystal structure, said semiconductor-metal compound layer has a face-centered cubic crystal structure, and said compound layer is amorphous.

12. The method for fabricating a semiconductor device of claim 1, 2, 7, 8, 9 or 10, wherein said particle energy beam includes a nonmetal element.

13. The method for fabricating a semiconductor device of claim 1, 2, 7, 8, 9 or 10, wherein said semiconductor layer has a face-centered cubic crystal structure, and said semiconductor-metal compound layer has a face-centered cubic crystal structure.

14. The method for fabricating a semiconductor device of claim 1, 2, 7, 8, 9 or 10, wherein said semiconductor layer has a diamond or zinc blende crystal structure, and said semiconductor-metal compound layer has a calcium fluoride crystal structure.

15. The method for fabricating a semiconductor device of claim 1, 2, 7, 8, 9 or 10, wherein said semiconductor layer is a silicon layer, said nonmetal element is oxygen, said metal film is a cobalt film, and said semiconductor-metal compound layer is a cobalt silicide layer.

16. The method for fabricating a semiconductor device of claim 1, 2, 7, 8, 9 or 10, wherein said nonmetal element is an oxygen element, a nitrogen element or a fluorine element.

* * * * *